United States Patent
Agarwal et al.

(10) Patent No.: US 11,658,123 B2
(45) Date of Patent: May 23, 2023

(54) HYBRID BRIDGED FANOUT CHIPLET CONNECTIVITY

(71) Applicant: ADVANCED MICRO DEVICES, INC., Santa Clara, CA (US)

(72) Inventors: Rahul Agarwal, Santa Clara, CA (US); Milind S. Bhagavat, Broomfield, CO (US)

(73) Assignee: ADVANCED MICRO DEVICES, INC., Santa Clara, CA (US)

( * ) Notice: Subject to any disclaimer, the term of this patent is extended or adjusted under 35 U.S.C. 154(b) by 103 days.

(21) Appl. No.: 17/032,544

(22) Filed: Sep. 25, 2020

(65) Prior Publication Data

US 2022/0102276 A1 Mar. 31, 2022

(51) Int. Cl.
*H01L 23/538* (2006.01)
*H01L 23/00* (2006.01)

(52) U.S. Cl.
CPC .......... *H01L 23/5381* (2013.01); *H01L 24/13* (2013.01); *H01L 24/24* (2013.01); *H01L 24/25* (2013.01); *H01L 24/82* (2013.01); *H01L 2224/13024* (2013.01); *H01L 2224/24137* (2013.01); *H01L 2224/24991* (2013.01); *H01L 2224/25171* (2013.01); *H01L 2224/25174* (2013.01); *H01L 2224/25177* (2013.01); *H01L 2224/82801* (2013.01)

(58) Field of Classification Search
CPC ..... H01L 23/5381; H01L 24/13; H01L 24/24; H01L 24/25; H01L 24/85
See application file for complete search history.

(56) References Cited

U.S. PATENT DOCUMENTS

| | | | | |
|---|---|---|---|---|
| 11,276,645 | B2 * | 3/2022 | Zhao | H01L 23/49827 |
| 2016/0293534 | A1 * | 10/2016 | Shen | H01L 25/03 |
| 2016/0329284 | A1 * | 11/2016 | We | H01L 23/5383 |
| 2017/0032832 | A1 * | 2/2017 | Suwa | H01L 23/49844 |
| 2020/0098724 | A1 * | 3/2020 | Liff | H01L 23/36 |
| 2020/0098725 | A1 | 3/2020 | Liff et al. | |
| 2020/0105718 | A1 | 4/2020 | Collins et al. | |
| 2020/0176384 | A1 * | 6/2020 | Wu | H01L 21/4857 |
| 2020/0273799 | A1 * | 8/2020 | Sung | H01L 24/32 |
| 2020/0411438 | A1 * | 12/2020 | Koh | H01L 24/20 |
| 2021/0159141 | A1 * | 5/2021 | Sikka | H01L 23/5386 |
| 2021/0202426 | A1 * | 7/2021 | Shim | H01L 21/6836 |
| 2021/0249381 | A1 * | 8/2021 | Knickerbocker | H01L 21/563 |
| 2021/0296246 | A1 * | 9/2021 | Lane | H01L 21/4857 |
| 2021/0384133 | A1 * | 12/2021 | Ong | H01L 23/5386 |
| 2021/0391263 | A1 * | 12/2021 | Nie | H01L 23/5385 |
| 2021/0398906 | A1 * | 12/2021 | Qian | H01L 23/5381 |
| 2021/0407962 | A1 * | 12/2021 | Kim | H01L 23/5383 |
| 2022/0028790 | A1 * | 1/2022 | Roy | H01L 23/5381 |
| 2022/0052023 | A1 * | 2/2022 | Fu | H01L 24/13 |
| 2022/0189934 | A1 * | 6/2022 | Kim | H01L 23/49822 |

OTHER PUBLICATIONS

International Search Report and Written Opinion, PCT/US2021/051189, dated Mar. 22, 2021, 17 pages.

* cited by examiner

*Primary Examiner* — Nathan W Ha (57) ABSTRACT

A chip for hybrid bridged fanout chiplet connectivity, the chip comprising: a central chiplet; one or more first chiplets each coupled to the central chiplet using a plurality of fanout traces; and one or more second chiplets each coupled to the central chiplet using one or more interconnect dies (ICDs).

27 Claims, 7 Drawing Sheets

HYBRID BRIDGED FANOUT CHIPLET CONNECTIVITY

BACKGROUND

A chip composed of multiple chiplets may require interconnections between a central chiplet and each of the remaining chiplets. For example, interconnecting dies (ICDs) or bridges can be used to connect a central chiplet to chiplets adjacent to the central chiplet. However, an active bridge die that covers multiple chiplets can impact the power and ground connections to the dies. Fanout traces can be used to connect the chiplets to the central chiplet. However, even with high density fanout routing layers, routing all the traces from a limited area of the central chiplet (e.g., a particular side or face of the chiplet) is not possible.

DETAILED DESCRIPTION

Hybrid bridged fanout chiplet connectivity, according to various embodiments of the present disclosure, includes: coupling, to a central chiplet of a chip, one or more first chiplets using a plurality of fanout traces. Such hybrid bridged fanout chiplet connectivity also includes coupling, to the central chiplet, one or more second chiplets using one or more interconnect dies (ICDs).

In some embodiments, each of the one or more second chiplets are positioned nearer to the central chiplet relative to the one or more first chiplets. In some embodiments, the one or more first chiplets are positioned in a first column of chiplets and the one or more second chiplets are positioned in a second column of chiplets. In some embodiments, the one or more first chiplets are positioned in a first row of chiplets and the one or more second chiplets are positioned in a second row of chiplets. In some embodiments, coupling, to the central chiplet, the one or more first chiplets includes layering a plurality of fanout trace layers on a wafer comprising the central chiplet, the one or more first chiplets, and the one or more second chiplets. In some embodiments, coupling, to the central chiplet, the one or more second chiplets includes bonding the one or more interconnect dies to a layer of the chip. In some embodiments, the method further includes forming one or more conductive pillars in a layer of the chip. In some embodiments, the method further includes capping the one or more conductive pillars and the one or more interconnect dies. In some embodiments, the one or more second chiplets include a plurality of second chiplets, the one or more interconnecting dies include a plurality of interconnecting dies, and each of the plurality of second chiplets is coupled to the central chiplet using a respective interconnecting die of the plurality of interconnecting dies.

In some embodiments, a chip for hybrid bridged fanout chiplet connectivity includes: a central chiplet; one or more first chiplets each coupled to the central chiplet using a plurality of fanout traces; and one or more second chiplets each coupled to the central chiplet using one or more interconnect dies (ICDs).

In some embodiments, each of the one or more second chiplets are positioned nearer to the central chiplet relative to the one or more first chiplets. In some embodiments, the one or more first chiplets are positioned in a first column of chiplets and the one or more second chiplets are positioned in a second column of chiplets. In some embodiments, the one or more first chiplets are positioned in a first row of chiplets and the one or more second chiplets are positioned in a second row of chiplets. In some embodiments, the one or more first chiplets are coupled to the central chiplet by a plurality of fanout trace layers layered on a wafer including the central chiplet, the one or more first chiplets, and the one or more second chiplets. In some embodiments, the one or more interconnect dies are bonded to a layer of the chip layered on the plurality of fanout trace layers. In some embodiments, the chip further includes one or more conductive pillars. In some embodiments, the chip further includes a plurality of caps for the one or more conductive pillars and the one or more interconnect dies (ICDs). In some embodiments, the one or more second chiplets include a plurality of second chiplets, the one or more interconnecting dies include a plurality of interconnecting dies, and each of the plurality of second chiplets is coupled to the central chiplet using a respective interconnecting die of the plurality of interconnecting dies.

In some embodiments, an apparatus for hybrid bridged fanout chiplet connectivity includes: one or more components, wherein at least one component is operatively coupled to a chip and the chip includes: a central chiplet; one or more first chiplets each coupled to the central chiplet using a plurality of fanout traces; and one or more second chiplets each coupled to the central chiplet using one or more interconnect dies (ICDs).

In some embodiments, each of the one or more second chiplets are positioned nearer to the central chiplet relative to the one or more first chiplets. In some embodiments, the one or more first chiplets are positioned in a first column of chiplets and the one or more second chiplets are positioned in a second column of chiplets. In some embodiments, the one or more first chiplets are positioned in a first row of chiplets and the one or more second chiplets are positioned in a second row of chiplets. In some embodiments, the one or more first chiplets are coupled to the central chiplet by a plurality of fanout trace layers layered on a wafer including the central chiplet, the one or more first chiplets, and the one or more second chiplets. In some embodiments, the one or more interconnect dies are bonded to a layer of the chip layered on the plurality of fanout trace layers. In some embodiments, the chip further includes one or more conductive pillars. In some embodiments, the chip further includes a plurality of caps for the one or more conductive pillars and the one or more interconnect dies (ICDs). In some embodiments, the one or more second chiplets include a plurality of second chiplets, the one or more interconnecting dies include a plurality of interconnecting dies, and each of the plurality of second chiplets is coupled to the central chiplet using a respective interconnecting die of the plurality of interconnecting dies.

Figure 1A:
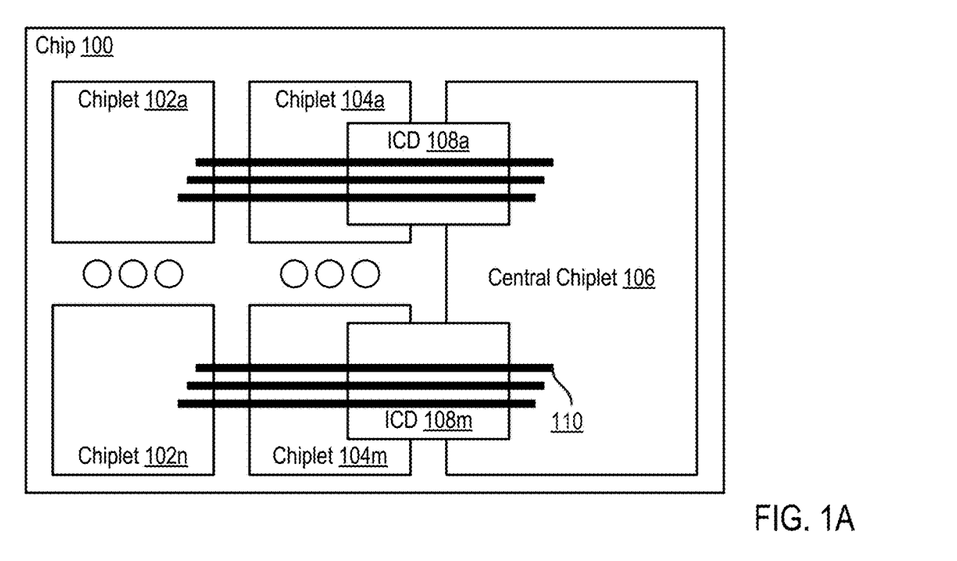
FIG. 1A is a block diagram of an example chip for hybrid bridged fanout chiplet connectivity according to some embodiments.

FIG. 1A is a block diagram of a non-limiting example chip 100. The example chip 100 can be implemented in a variety of computing devices, including mobile devices, personal computers, peripheral hardware components, gaming devices, set-top boxes, and the like. The chip 100 includes a plurality of chiplets 102a-n, 104a-m. Each of the chiplets 102a-n, 104a-m is a functional circuit block designed to integrate with other chiplets 102a-n, 104a-m. The chip 100 also includes a central chiplet 106. The central chiplet 106 is distinguished from other chiplets 102a-n, 104a-m in that each of the other chiplets 102a-n, 104a-m is coupled (e.g., communicatively coupled, conductively coupled) to the central chiplet 106. Each of the chiplets 102a-n, 104a-m and the central chiplet 106 are located on an organic substrate. The organic substrate is composed of organic small molecules or polymers, including polycyclic aromatic compounds such as pentacene, anthracene, and rubrene. Each of the chiplets 102a-n, 104a-m and the central chiplet 106 are located within a layer of molding, such as epoxy. The molding serves to fix the chiplets 102a-n, 104a-m and the central chiplet 106 in place. The molding layer is coplanar to the chiplets 102a-n, 104a-m and the central chiplet 106 to allow for additional redistribution layers to be applied on the chiplets 102a-n, 104a-m and the central chiplet 106.

A communicative connection between the central chiplet 106 and the chiplets 102a-n, 104a-m is utilized to perform input/output communications between the components of the chip. One existing solution for connecting multiple chiplets 102a-n, 104a-m to a central chiplet 106 includes utilizing an interconnecting die (ICD) or active bridge die that can be used to connect a central chiplet 106 to chiplets 104a-m adjacent to the central chiplet 106. However, such an active bridge die that covers multiple chiplets can impact the power and ground connections to the chiplet dies. An alternative existing implementation of connecting chiplets to a central chiplet includes utilizing fanout traces (e.g., embedded in redistribution layers) to connect the chiplets m to the central chiplet. However, even with high density fanout routing layers, routing all the necessary traces from a limited area of the central chiplet to many different other chiplets is often not possible and does not scale as the number of chiplets needing to be connected to the central chiplet increases.

The example chip 100 of FIG. 1A, however, implements interconnecting dies (ICDs) (e.g., bridge dies) 108a-m to couple the central chiplet 106 to those of the chiplets 102a-n, 104a-m nearest to the central chiplet 106 and a plurality of fanout traces 110 to connect the central chiplet 106 to those of the chiplets 102a-n, 104a-m that are not connected to the central chiplet 106 using the interconnecting dies 108a-m. In this configuration, connections that implement both a fanout and an ICD to couple multiple chiplets to a central chiplet are referred to as a hybrid bridged fanout interconnect. In this way, power and ground connections are not affected by the ICD and designs that utilize such a hybrid bridged fanout interconnect enable the number of chiplets being coupled to the central chiplet to be scalable.

Interconnecting dies 108a-m are silicon dies that provide a connective coupling between two chiplets. For example, both the central chiplet 106 and the chiplets 104a-m each include multiple input/output (I/O) connection points of metal or other conductive material. The interconnecting dies 108a-m include conductive pathways that terminate in I/O connection points. By aligning the I/O connection points of the interconnecting dies 108a-m with the I/O connection points of the central chiplet 106 and chiplets 104a-m and then bonding interconnecting dies 108a-m to the central chiplet 106 and chiplets 104a-m, conductive pathways are formed between the central chiplet 106 and chiplets 104a-m through the interconnecting dies 108a-m. In the example shown, the chip 100 includes two columns of chiplets, with the column of chiplets 104a-m being closest to the central chiplet 106. Accordingly, interconnecting dies 108a-m connect the chiplets 104a-m to the central chiplet 106. For example, in some embodiments, each chiplet 104a-m to be connected using an interconnecting die 108a-m is connected to the central chiplet 106 using its own dedicated interconnecting die 108a-m. In other words, to connect m-numbers of chiplets 108a-m to the central chiplet 106, m-numbers of interconnecting dies 108a-m are used. In other embodiments, a single interconnecting die 108a-m is used to connect multiple chiplets 104a-m in the same column to the central chiplet 106.

The chip 100 also uses a plurality of fanout traces 110 to connect the central chiplet 106 to those of the chiplets 102a-n, 104a-m not connected to the central chiplet 106 using the interconnecting dies 108a-m. In the example chip 100, the chiplets 102a-n are connected to the central chiplet 106 using the fanout traces 110. Fanout traces 110 are traces of conductive material such as carbon, silver, aluminum, and the like traced in a layer of dielectric material, such as polyimide. The fanout traces 110 are traced into multiple layers of dielectric material, hereinafter referred to as fanout trace layers. The fanout trace layers into which the fanout traces 110 are embedded are redistribution layers. A redistribution layer generally is an extra metal layer on a chip that makes the I/O pads of an integrated circuit available in other locations of the chip for better access to the pads where necessary. Each fanout trace 110 connects the central chiplet 106 to a chiplet 102a-n via one or more conductive interconnects in the intermediary layers of the chip 100 (e.g., intermediary fanout trace layers or other redistribution layers). For example, a fanout trace 110 provides a conductive link from an I/O connection point of the chiplet 102a-n to an I/O connection point of the central chiplet 106.

In some embodiments, each fanout trace layer includes a fanout trace 110 from the central chiplet 106 to each chiplet 102a-n to be connected using the fanout traces 110. For example, a first fanout trace layer includes first fanout traces 110 from the central chiplet 106 to each chiplet 102a-n, a second fanout trace layer includes second traces 110 from the central chiplet 106 to each chiplet 102a-n, etc. Thus, assuming x-numbers of fanout trace layers, each chiplet 102a-n has x-numbers of fanout traces 110 to the central chiplet. One skilled in the art would appreciate that other combinations or distributions of fanout traces 110 in fanout trace layers are possible.

The chip 100 of FIG. 1A implements both interconnecting dies 108a-m to couple the central chiplet 106 to the nearest chiplets 104a-m, and fanout traces 110 to connect the central chiplet 106 to the other, further chiplets 102a-n. One skilled in the art would appreciate that the arrangement of chiplets 102a-n, 104a-m and the central chiplet 106 are exemplary, and that other arrangements are possible. For example, in some embodiments, additional columns of chiplets sharing rows with the chiplets 102a-n, 104a-m are included in the chip 100. In some embodiments, an additional column of chiplets is positioned adjacent to an opposing face of the central chiplet 106 (e.g., the right face of the central chiplet 106 opposing the left face of the central chiplet 106). In such an embodiment, this additional column of chiplets is also connected to the central chiplet 106 using interconnecting dies, as this additional column of chiplets is positioned adjacent to the central chiplet 106. In some embodiments, further columns of chiplets are positioned adjacent to this additional column of chiplets and connected using additional fanout traces.

One skilled in the art would also appreciate that the use of "rows" or "columns" of chiplets as used herein is relative to which face of the central chiplet 106 a particular grouping of chiplets is positioned. For example, while the preceding example discussed connecting a column of chiplets 104a-m nearest to the left face of the central chiplet 106 using interconnecting dies 108a-m, in some embodiments, a row of chiplets closest to the upper or lower face of the central chiplet 106 is connected using interconnecting dies. In this example, additional rows of chiplets further from the upper or lower face of the central chiplet 106 would also be connected using fanout traces 110.

Figure 1B:
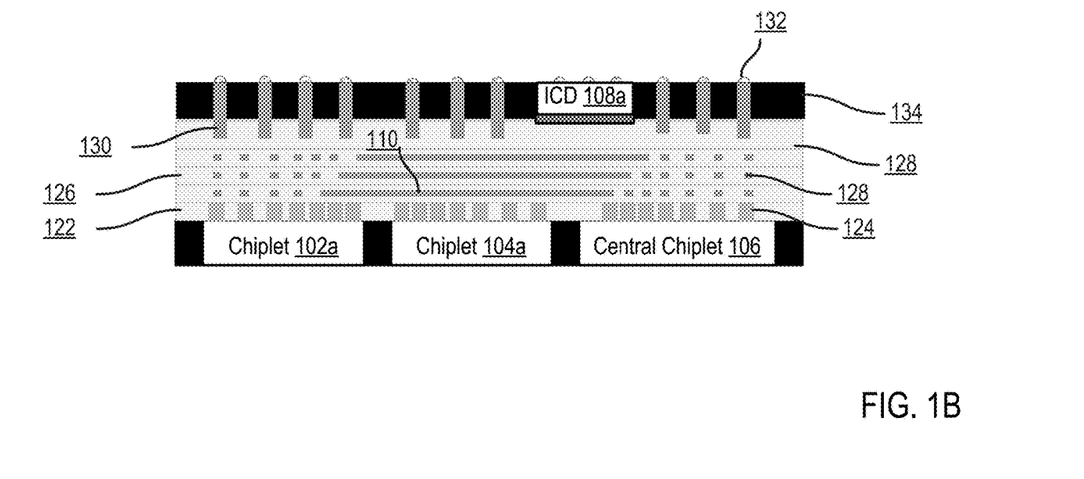
FIG. 1B is a diagram of an example chip for hybrid bridged fanout chiplet connectivity according to some embodiments.

FIG. 1B is a diagram of an example chip for hybrid bridged fanout chiplet connectivity according to some embodiments. For example, FIG. 1B depicts a lateral cross-section view of the chip 100 of FIG. 1A. FIG. 1B shows the chiplet 102a, chiplet 104a, and central chiplet 106 within a layer of molding 120. The molding 120 includes epoxy or another substance that fixes the chiplet 102a, chiplet 104a, and central chiplet 106 in position on a substrate (not shown). Such a substrate includes, for example, organic substrates composed of organic small molecules or polymers, including polycyclic aromatic compounds such as pentacene, anthracene, and rubrene.

A redistribution layer 122 is deposited on the layer of molding 120 that includes the chiplet 102a, chiplet 104a, and central chiplet 106. The redistribution layer 122 is composed of a dielectric material such as polyimide or another insulating material. The redistribution layer 122 includes conductive interconnects 124 composed of copper or another conductive material. The conductive interconnects 124 provide input/outpoint connectivity points for the chiplet 102a, chiplet 104a, and central chiplet 106. Thus, signals between any of the chiplet 102a, chiplet 104a, and central chiplet 106 use conductive pathways with the conductive interconnects 124 as endpoints.

Multiple fanout trace layers 126 are layered over the redistribution layer 122. The fanout trace layers 126 are redistribution layers (e.g., layers of dielectric material such as polyimide or another insulating material) that each house one or more fanout traces 110. The fanout traces 110 of each fanout trace layer 126 form signal paths between the central chiplet 106 and the chiplet 102. Each fanout trace layer 126 also includes conductive interconnects 128. Whereas the conductive interconnects 124 provide input/outpoint connectivity points for the chiplet 102a, chiplet 104a, and central chiplet 106, the conductive interconnects 128 provide a conductive pathway between fanout trace layers 126. Thus, a signal uses conductive interconnects 128 to travel between adjacent fanout trace layers 126, the redistribution layer 122, or the redistribution layer 130 to be described below.

Another redistribution layer 130 is layered over the fanout trace layers 126. The redistribution layer 130 houses conductive pillars 132 of copper or another conductive material. The conductive pillars 132 provide conductive pathways between caps 134 and the chiplets 102a, 104a, and central chiplet 106 via intervening conductive interconnects 124, 128. The caps 132 are composed of a tin-silver alloy or other substance suitable for solderable connections. Also housed in the redistribution layer 130 is the interconnecting die 108a. The interconnecting die 108a forms a signal pathway between the central chiplet 106 and 104a using the conductive interconnects 128 of the intervening redistribution layers 126. The conductive pillars 130 and interconnecting die 108a are further housed in another layer of molding 134 to hold the conductive pillars 130 and interconnecting die 108a in place.

Figure 2A:
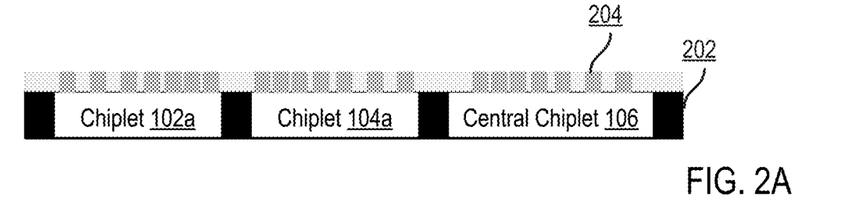
FIG. 2A is diagram of a stage of a fabrication process of a chip for hybrid bridged fanout chiplet connectivity according to some embodiments.

FIGS. 2A-2D show example lateral views for fabrication stages for a chip for hybrid bridged fanout chiplet connectivity according to some embodiments. As shown in FIG. 2A, silicon dies for a central chiplet 106, a chiplet 102a and a chiplet 104a are reconstituted on a carrier (not shown). Reconstituting the central chiplet 106, the chiplet 102a and the chiplet 104a includes placing the central chiplet 106, the chiplet 102a and the chiplet 104a on the carrier and applying molding 202 around the central chiplet 106, the chiplet 102a and the chiplet 104a to fix their positions in the chip 100. In some embodiments, the molding 202 includes epoxy or another material. A front side aluminum layer 204 is exposed to allow conductive connectivity the central chiplet 106, the chiplet 102a and the chiplet 104a. Although FIG. 2A describes an aluminum layer 204, it is understood that the use of other conductive materials instead of or in addition to aluminum is possible.

Figure 2B:
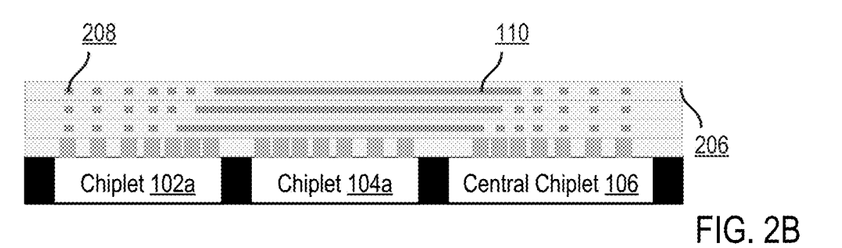
FIG. 2B is diagram of a stage of a fabrication process of a chip for hybrid bridged fanout chiplet connectivity according to some embodiments.

As shown in FIG. 2B, fanout trace layers 206 are applied to the chip 100 on the aluminum layer 204. Each fanout trace layer 206 is a redistribution layer that includes one or more fanout traces 110 composed of copper or another conductive material. In this example, the fanout traces 110 provide a connection between the central chiplet 106 and the chiplet 102a. Each fanout trace layer 206 also includes conductive interconnects 208 providing conductive paths between fanout trace layers 206. The conductive interconnects 208 are composed of copper or another conductive material. The fanout trace layers 206 are also composed of a dielectric material such as polyimide or another insulating material. Thus, the dielectric material of the fanout trace layers 206 house the fanout traces 110 and conductive interconnects 208. By applying multiple fanout trace layers 206, multiple connection paths of the fanout traces 110 couple the central chiplet 106 to the chiplet 102a. Moreover, the conductive interconnects 208 allow for signal transfer between the fanout trace layers 206 to the chiplet 102a, chiplet 104a, and central chiplet 106. For example and as described in further detail below, signal pathways from the chiplet 102a, chiplet 104a, and central chiplet 106 are formed via the conductive interconnects 208 of the fanout trace layers 206, terminating in solderable connection points on the surface of the chip.

Figure 2C:
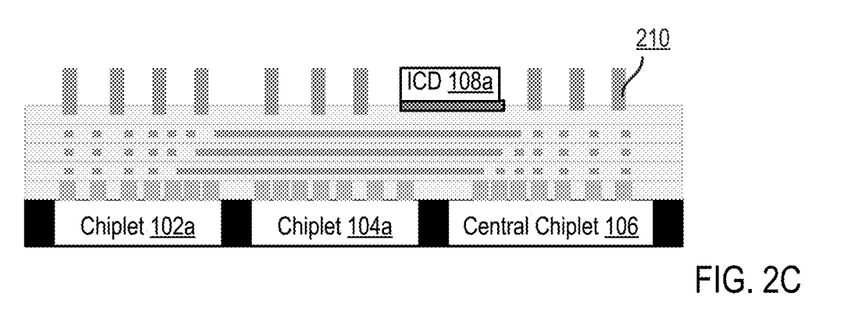
FIG. 2C is diagram of a stage of a fabrication process of a chip for hybrid bridged fanout chiplet connectivity according to some embodiments.

As shown in FIG. 2C, another layer of dielectric material (e.g., another redistribution layer) is applied on top of the fanout trace layers 208. Conductive pillars 210 are formed in this applied redistribution layer. In some embodiments, forming the conductive pillars 210 includes inserting preformed conductive pillars in the dielectric material forming the redistribution layer. In other embodiments, forming the conductive pillars includes extruding the conductive material to form the conductive pillars in the redistribution layer. The conductive pillars 210 are composed of copper or another conductive material. An interconnecting die 108a is placed to this redistribution layer to provide a connective coupling between the central chiplet 106 and the chiplet 104a via the conductive interconnects 208 included in the intermediary fanout trace layers 206. For example, the interconnecting die 108a includes conductive pathways that, on one end, come into contact or are bonded to conductive interconnects 208 coupled to the central chiplet 106, and on another end, come into contact or are bonded to conductive interconnects 208 coupled to the chiplet 104a. In some embodiments the interconnecting die 108a includes one or more through-silicon vias that provide a conductive pathway through the interconnecting die 108a, from one side of the interconnecting die 108a to the opposing face of the interconnecting die 108a (e.g., from the top of the interconnecting die 108a to the opposing face in the redistribution layer). Thus, solderable connections may be formed with the interconnecting die 108a through the through-silicon vias and into the underlying fanout trace layers 206 and other components.

Figure 2D:
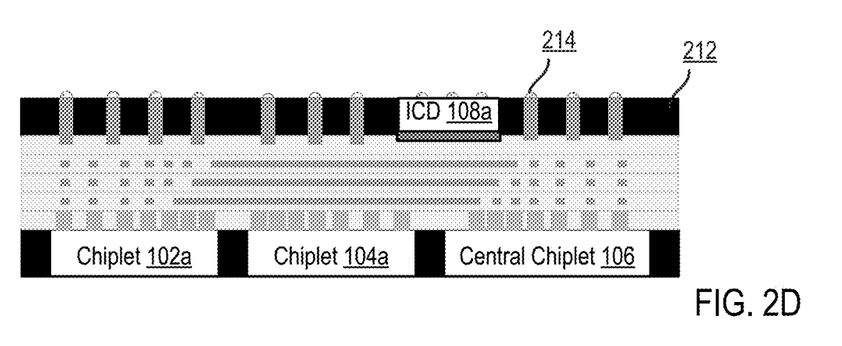
FIG. 2D is diagram of a stage of a fabrication process of a chip for hybrid bridged fanout chiplet connectivity according to some embodiments.

As shown in FIG. 2D, additional molding 212 is applied to the chip 100. The molding 212 is then partially ground to expose the conductive pillars 210 and, if any, the through-silicon vias of the interconnecting die 108. Thus, the ground molding 212 is coplanar with the exposed conductive pillars 210 and through-silicon vias. Caps 214 are applied to the conductive pillars 210 and the exposed through-silicon vias of the interconnecting die 108a. The caps 214 are composed of a tin-silver alloy or other substance suitable for solderable connections.

Although FIGS. 2A-2D show a fabrication process by which layers of components are applied on the chiplets 102a, 104a, and central chiplet 106 (e.g., a "die first" fabrication process), it is understood that in some embodiments the chip 100 is fabricated using a "die last" fabrication process. For example, the chiplets 102a, 104a, and central chiplet 106 are applied as part of a last-applied layer of the chip 100.

Figure 3:
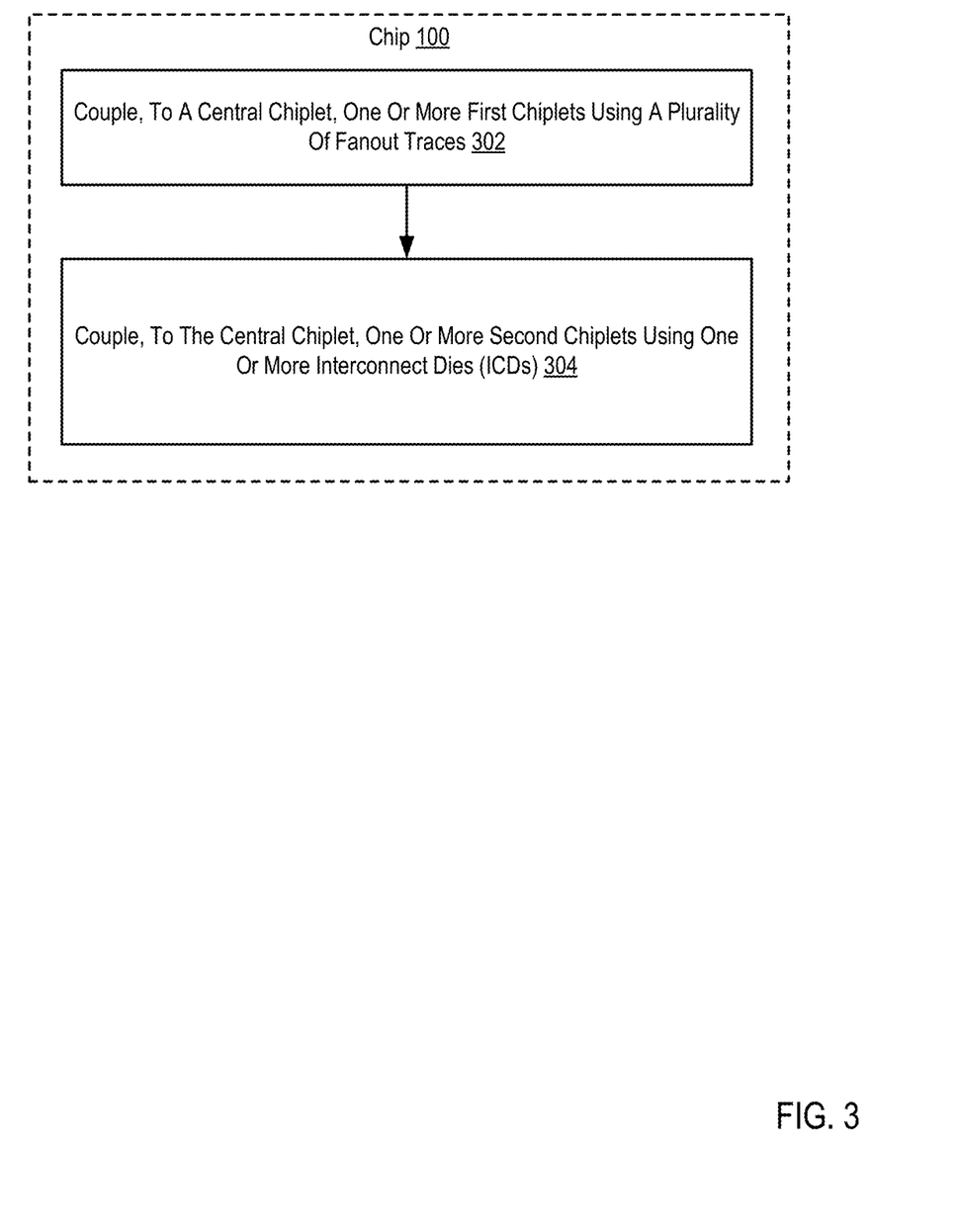
FIG. 3 is a flowchart of an example method for hybrid bridged fanout chiplet connectivity according to some embodiments.

For further explanation, FIG. 3 sets forth a flow chart illustrating an exemplary method for hybrid bridged fanout chiplet connectivity that includes coupling 302 (e.g., in a chip 100), to a central chiplet 106, one or more first chiplets 102a-n using a plurality of fanout traces 110. In some embodiments, the one or more first chiplets 102a-n are included in a same column of plurality of columns of chiplets 102a-n, 104a-m. In such an embodiment, the plurality of first chiplets 102a-n are those of the chiplets 102a-n, 104a-m not adjacent to the central chiplet 106 (e.g., separated from the central chiplet 106 by one or more other columns of chiplets). In some embodiments, the one or more first chiplets 102a-n are included in a same row of plurality of rows of chiplets 102a-n, 104a-m. In such an embodiment, the plurality of first chiplets 102a-n are those of the chiplets 102a-n, 104a-m not adjacent to the central chiplet 106 (e.g., separated from the central chiplet 106 by one or more other rows of chiplets). The fanout traces 110 are traces of copper or another conductive material etched into or applied to a layer of dielectric material. In some embodiments, the fanout traces 110 couple the central chiplet 106 and chiplets 102a-n via one or more intermediary layers through one or more conductive interconnects 208.

The method of FIG. 3 also includes coupling 304, to the central chiplet 106, one or more second chiplets 104a-m using one or more interconnect dies 108a-m. The interconnect dies 108a-m are dies of silicon that provide connective links between a chiplet 108a-m and the central chiplet 106. In some embodiments, each chiplet 104a-m to be connected using an interconnecting die 108a-m is connected to the central chiplet 106 using its own dedicated interconnecting die 108a-m. In other words, to connect m-numbers of chiplets 108a-m to the central chiplet 106, m-numbers of interconnecting dies 108a-m are used. In some embodiments, the one or more second chiplets 104a-m are included in a same column of plurality of columns of chiplets 102a-n, 104a-m. In such an embodiment, the plurality of second chiplets 104a-m are those of the chiplets 102a-n, 104a-m in a column of chiplets adjacent to or nearest to the central chiplet 106. In some embodiments, the one or more second chiplets 104a-m are included in a same row of a plurality of rows of chiplets 102a-n, 104a-m. In such an embodiment, the plurality of second chiplets 104a-m are those of the chiplets 102a-n, 104a-m in a row of chiplets adjacent to or nearest to the central chiplet 106.

Figure 4:
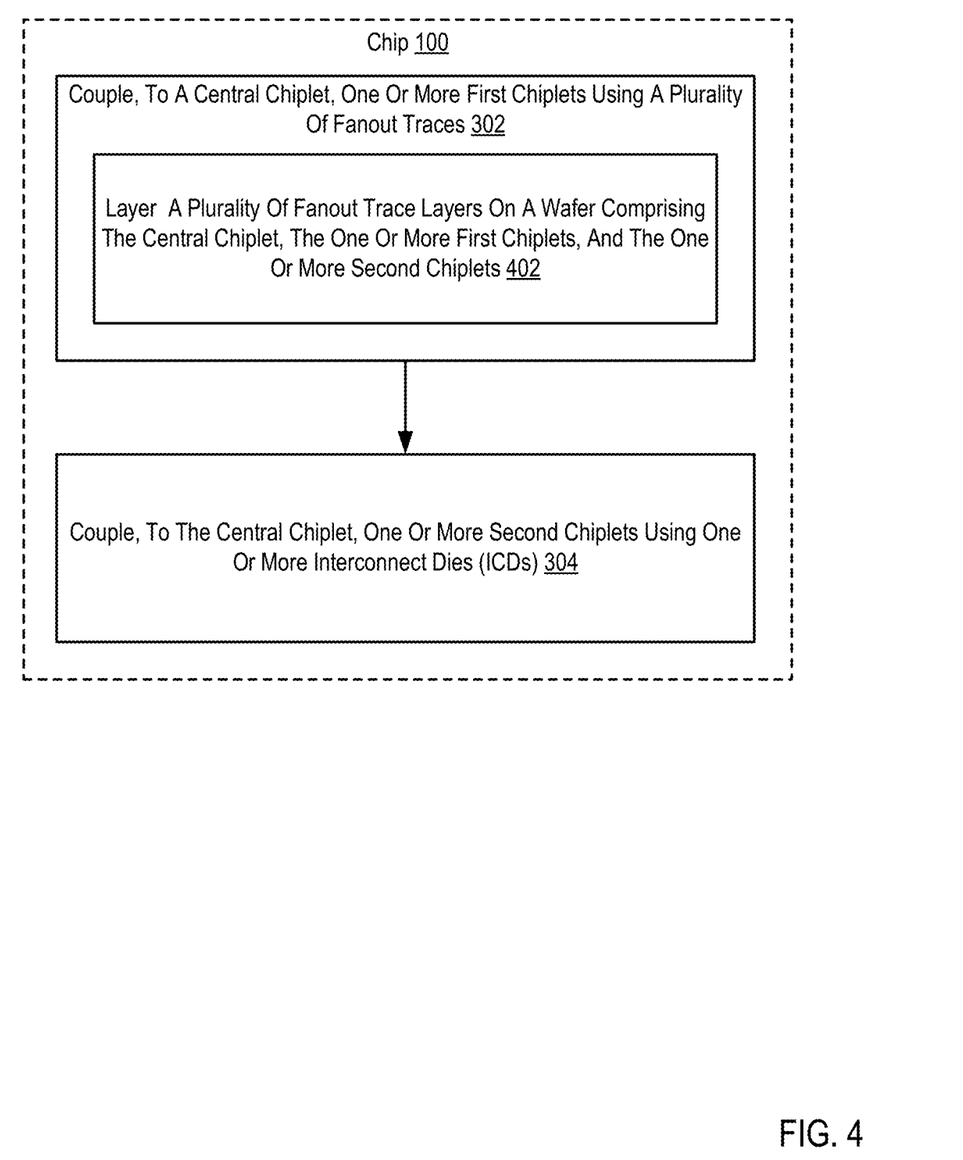
FIG. 4 is a flowchart of an example method for hybrid bridged fanout chiplet connectivity according to some embodiments.

For further explanation, FIG. 4 sets forth a flow chart illustrating an exemplary method for hybrid bridged fanout chiplet connectivity. The method of FIG. 4 is similar to the method of FIG. 3 in that, the method of FIG. 4 also includes coupling 302 to a central chiplet 106, one or more first chiplets 102a-n using a plurality of fanout traces 110 and coupling 304 (e.g., in the chip 100), to the central chiplet 106, one or more second chiplets 104a-m using one or more interconnect dies 108a-m.

The method of FIG. 4 differs from FIG. 3 in that coupling 302 (e.g., in a chip 100), to a central chiplet 106, one or more first chiplets 102a-n using a plurality of fanout traces 110 includes layering 402 a plurality of fanout trace layers 206 on a wafer comprising the central chiplet 106, the one or more first chiplets 102a-n and the one or more second chiplets 104a-m. The wafer includes the reconstituted central chiplet 106, the one or more first chiplets 102a-n and the one or more second chiplets 104a-m positioned and fixed in place using molding 202 (e.g., epoxy or another material). In some embodiments, the plurality of fanout trace layers 206 are layered on an exposed aluminum layer bonded to or connected to the central chiplet 106, the one or more first chiplets 102a-n and the one or more second chiplets 104a-m.

Fanout traces 110 are traces of conductive material such as carbon, silver, aluminum, and the like traced in a later of dielectric material, such as polyimide. The fanout traces 110 are traced into multiple layers of dielectric material. Each fanout trace 110 connects the central chiplet 106 to a first chiplet 102a-n via one or more conductive interconnects in the intermediary layers of the chip 100 (e.g., intermediary fanout trace layers 206 or other layers).

In some embodiments, each fanout trace layer 206 includes a fanout trace 110 from the central chiplet 106 to each second chiplet 102a-n to be connected using the fanout traces 110. For example, a first fanout trace layer includes first fanout traces 110 from the central chiplet 106 to each chiplet 102a-n, a second fanout trace layer includes first second traces 110 from the central chiplet 106 to each chiplet 102a-n, etc. Thus, assuming x-numbers of fanout trace layers 206, each chiplet 102a-n has x-numbers of fanout traces 110 to the central chiplet. One skilled in the art would appreciate that other combinations or distributions of fanout traces 110 in fanout trace layers 206 are possible.

Figure 5:
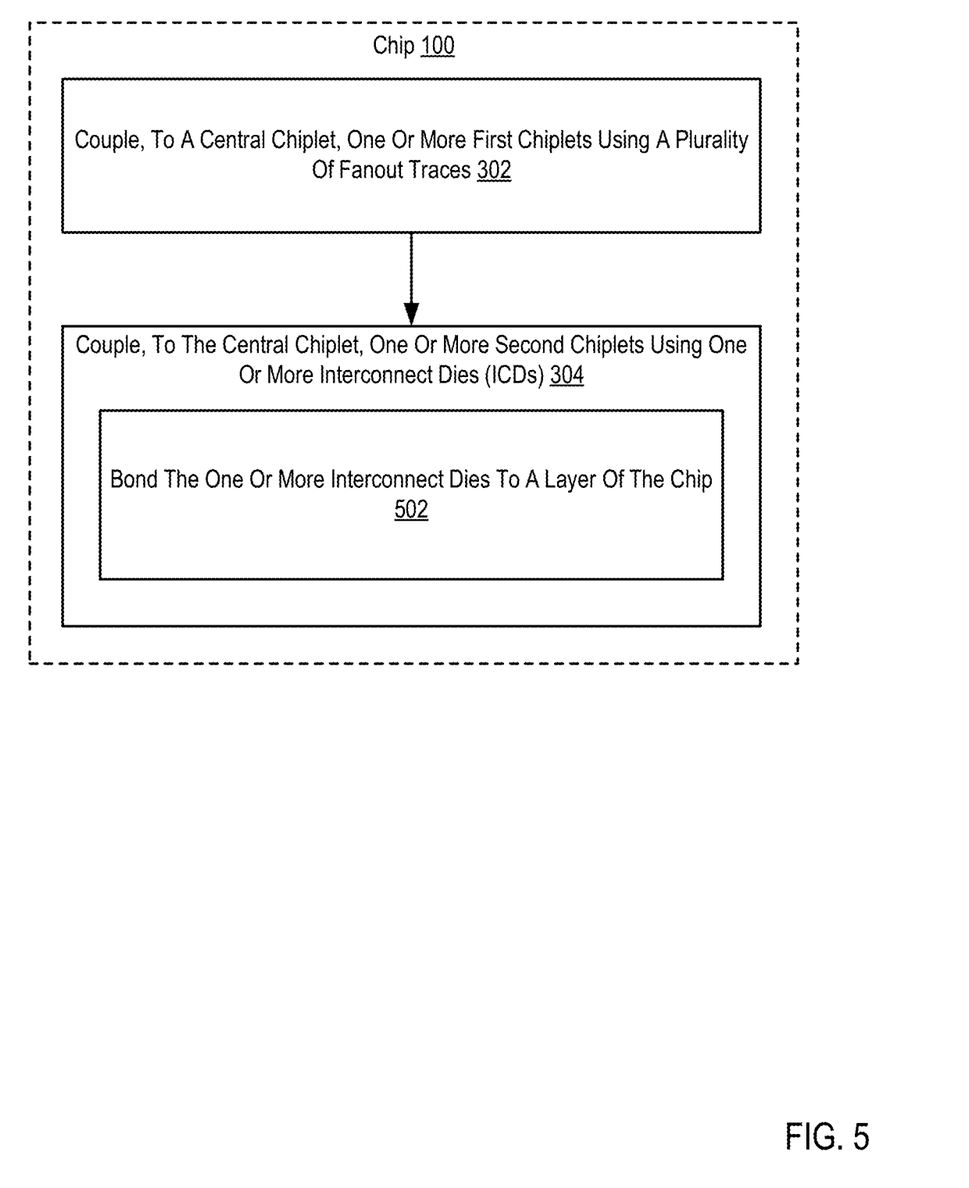
FIG. 5 is a flowchart of an example method for hybrid bridged fanout chiplet connectivity according to some embodiments.

For further explanation, FIG. 5 sets forth a flow chart illustrating an exemplary method for hybrid bridged fanout chiplet connectivity according some embodiments of the present disclosure. The method of FIG. 5 is similar to the method of FIG. 3 in that the method of FIG. 5 also includes coupling 302, to a central chiplet 106, one or more first chiplets 102a-n using a plurality of fanout traces 110 and coupling 304 (e.g., in the chip 100), to the central chiplet 106, one or more second chiplets 104a-m using one or more interconnect dies 108a-m.

The method of FIG. 5 differs from FIG. 3 in that coupling 304 (e.g., in the chip 100), to the central chiplet 106, one or more second chiplets 104a-m using one or more interconnect dies 108a-m includes bonding 502 the one or more interconnect dies 108a-m to a layer of the chip. In some embodiments, the layer to which the one or more interconnect dies 108a-m are bonded is layered on top of one or more fanout trace layers 206. Accordingly, in some embodiments, bonding 502 the one or more interconnect dies 108a-m includes bonding 502 the one or more interconnect dies 108a-m to conductive interconnects 208 in the fanout trace layers 206 that provide, for a given interconnect die 108a-m, a conductive connection to the central chiplet 106 and a corresponding second chiplet 104a-m. In some embodiments, the layer into which the one or more interconnect dies 108a-m are bonded includes a layer of dielectric material.

Figure 6:
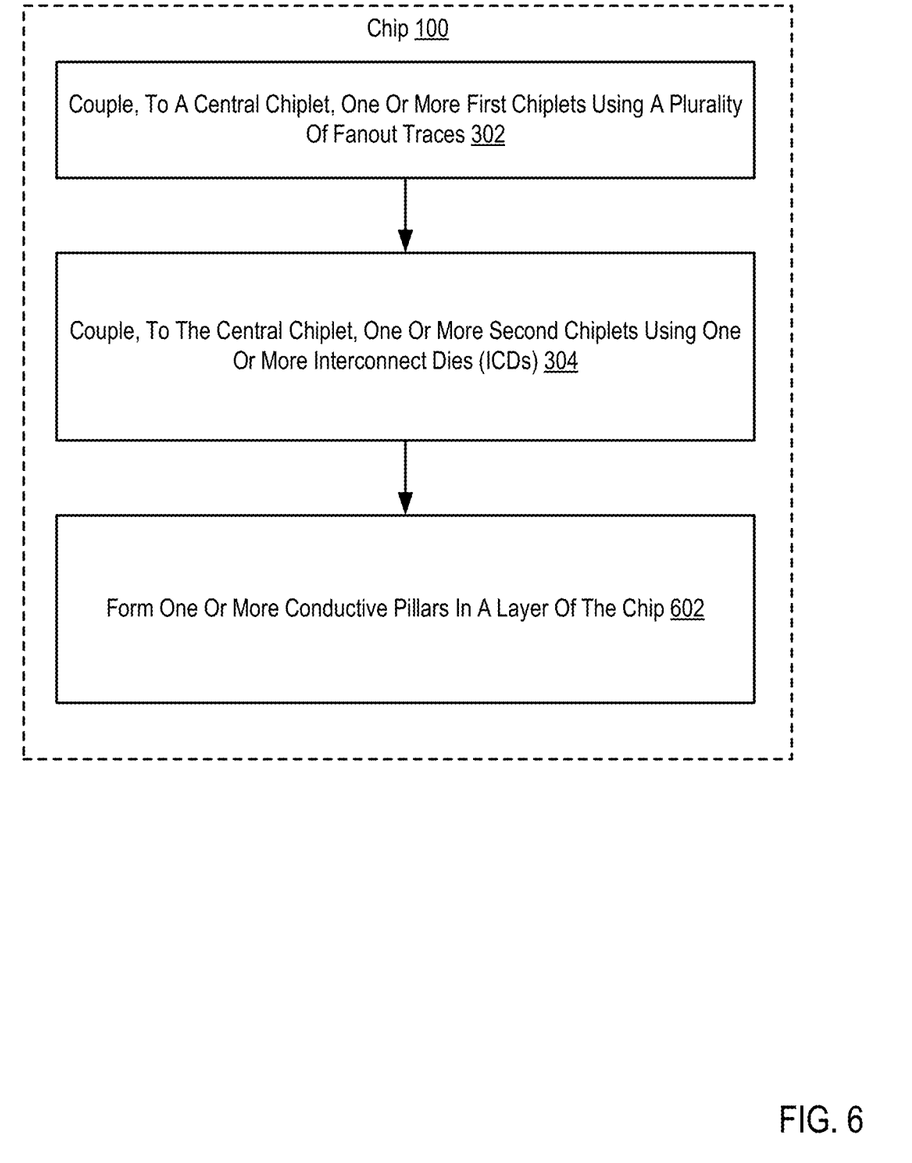
FIG. 6 is a flowchart of an example method for hybrid bridged fanout chiplet connectivity according to some embodiments.

For further explanation, FIG. 6 sets forth a flow chart illustrating another exemplary method for hybrid bridged fanout chiplet connectivity according to embodiments of the present disclosure. The method of FIG. 6 is similar to the method of FIG. 3 in that the method of FIG. 6 also includes coupling 302, to a central chiplet 106, one or more first chiplets 102a-n using a plurality of fanout traces 110; and coupling 304 (e.g., in the chip 100), to the central chiplet 106, one or more second chiplets 104a-m using one or more interconnect dies 108a-m.

The method of FIG. 6 differs from FIG. 3 in that the method of FIG. 6 also includes forming 602 one or more conductive pillars 210 in a layer of the chip 100. In some embodiments, the layer of the chip 100 into which the conductive pillars 210 are formed is a layer to which the one or more interconnective dies 108a-m are bonded. In some embodiments, the conductive pillars 210 are composed of copper or another conductive material. In some embodiments, forming 302 the conductive pillars 210 includes inserting preformed conductive pillars 210 in the dielectric material forming the layer. In other embodiments, forming the conductive pillars 210 includes extruding the conductive material to form the conductive pillars 210 in the layer. In some embodiments, molding 212 such as epoxy is applied around the conductive pillars 210.

Figure 7:
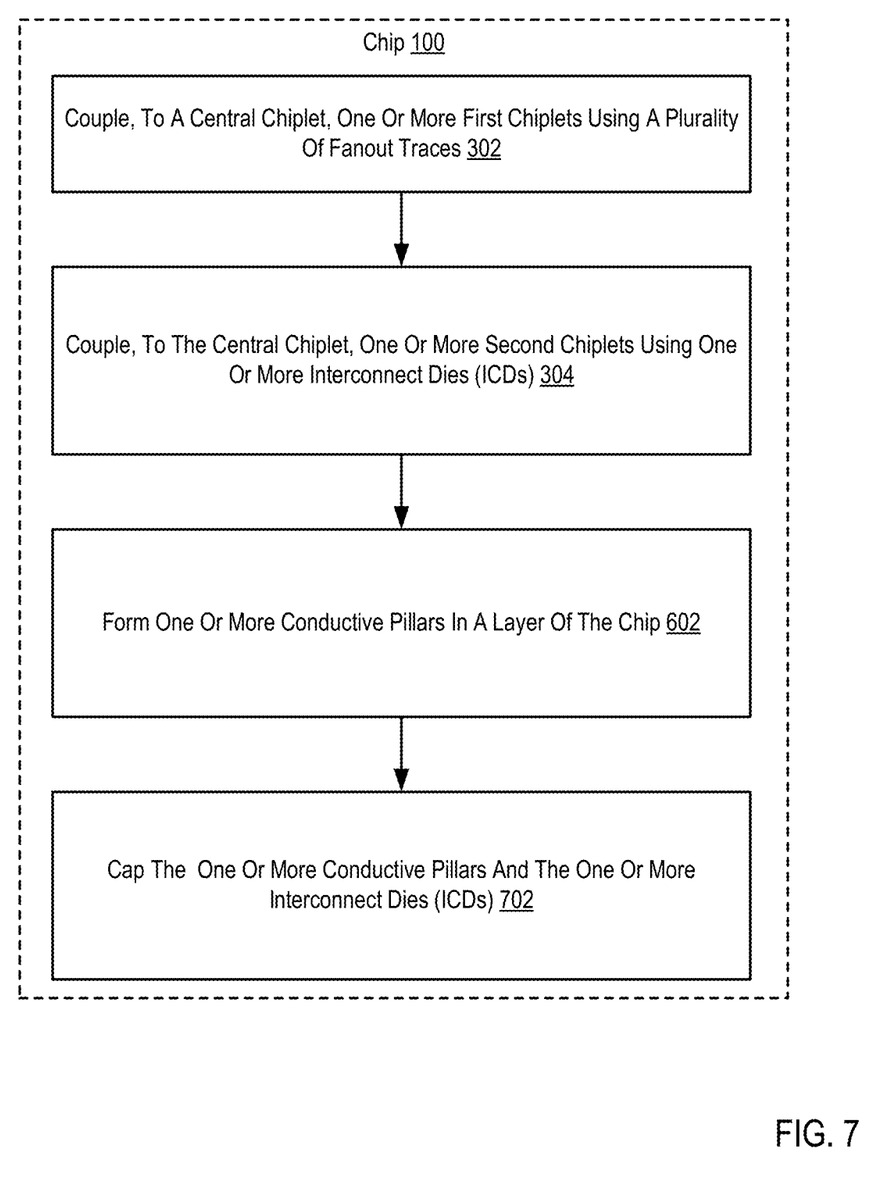
FIG. 7 is a flowchart of an example method for hybrid bridged fanout chiplet connectivity according to some embodiments.

For further explanation, FIG. 7 sets forth a flow chart illustrating another exemplary method for hybrid bridged fanout chiplet connectivity according to embodiments of the present disclosure. The method of FIG. 7 is similar to the method of FIG. 3 in that the method of FIG. 7 also includes coupling 302, to a central chiplet 106, one or more first chiplets 102a-n using a plurality of fanout traces 110 and coupling 304 (e.g., in the chip 100), to the central chiplet 106, one or more second chiplets 104a-m using one or more interconnect dies 108a-m; and forming 602 one or more conductive pillars 210 in a layer of the chip 100.

The method of FIG. 7 differs from FIG. 6 in that the method of FIG. 7 also includes capping 702 the one or more conductive pillars 210 and the one or more interconnect dies 108a-m. Capping 702 the one or more conductive pillars 210 and the one or more interconnect dies 108a-m includes applying an amount of a capping material to the one or more conductive pillars 210 and the one or more interconnect dies 108a-m to facilitate soldering or other connections. For example, in some embodiments, the capping material includes a tin-silver alloy or other substance suitable for solderable connections.

In view of the explanations set forth above, readers will recognize that the benefits of hybrid bridged fanout chiplet connectivity include:

Improved performance of a computing system by providing for low latency, high bandwidth connections between a central chiplet and other chiplets on the same chip set.

The flowchart and block diagrams in the Figures illustrate the architecture, functionality, and operation of possible implementations of systems, methods, and computer program products according to various embodiments of the present disclosure. In this regard, each block in the flowchart or block diagrams can represent a module, segment, or portion of instructions, which includes one or more executable instructions for implementing the specified logical function(s). In some alternative implementations, the functions noted in the block can occur out of the order noted in the figures. For example, two blocks shown in succession can, in fact, be executed substantially concurrently, or the blocks can sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

It will be understood from the foregoing description that modifications and changes can be made in various embodiments of the present disclosure. The descriptions in this specification are for purposes of illustration only and are not to be construed in a limiting sense. The scope of the present disclosure is limited only by the language of the following claims.

What is claimed is:

1. A chip for hybrid bridged fanout chiplet connectivity, the chip comprising:
   a central chiplet;
   one or more first chiplets each coupled to the central chiplet using a plurality of fanout traces and not connected to the central chiplet using an interconnect die; and
   one or more second chiplets each coupled to the central chiplet using one or more interconnect dies (ICDs), wherein the one or more interconnect dies are in a layer that does not include the plurality of fanout traces.

2. The chip of claim 1, wherein each of the one or more second chiplets are positioned nearer to the central chiplet relative to the one or more first chiplets.

3. The chip of claim 1, wherein the one or more first chiplets are positioned in a first column of chiplets and the one or more second chiplets are positioned in a second column of chiplets.

4. The chip of claim 1, wherein the one or more first chiplets are positioned in a first row of chiplets and the one or more second chiplets are positioned in a second row of chiplets.

5. The chip of claim 1, wherein the one or more first chiplets are coupled to the central chiplet by a plurality of fanout trace layers layered on a wafer including the central chiplet, the one or more first chiplets, and the one or more second chiplets positioned and fixed using molding.

6. The chip of claim 5, wherein the one or more interconnect dies are bonded to a redistribution layer of the chip layered on the plurality of fanout trace layers.

7. The chip of claim 1, further comprising one or more conductive pillars.

8. The chip of claim 7, further comprising a plurality of caps for the one or more conductive pillars and the one or more interconnect dies (ICDs).

9. The chip of claim 8, wherein the one or more second chiplets include a plurality of second chiplets, the one or more interconnecting dies include a plurality of interconnecting dies, and wherein each of the plurality of second chiplets is coupled to the central chiplet using a respective interconnecting die of the plurality of interconnecting dies.

10. An apparatus for hybrid bridged fanout chiplet connectivity, the apparatus comprising:
one or more components, wherein at least one component is operatively coupled to a chip and the chip comprises:
a central chiplet;
one or more first chiplets each coupled to the central chiplet using a plurality of fanout traces and not connected to the central chiplet using an interconnect die; and
one or more second chiplets each coupled to the central chiplet using one or more interconnect dies (ICDs), wherein the one or more interconnect dies are in a layer that does not include the plurality of fanout traces.

11. The apparatus of claim 10, wherein each of the one or more second chiplets are positioned nearer to the central chiplet relative to the one or more first chiplets.

12. The apparatus of claim 10, wherein the one or more first chiplets are positioned in a first column of chiplets and the one or more second chiplets are positioned in a second column of chiplets.

13. The apparatus of claim 10, wherein the one or more first chiplets are positioned in a first row of chiplets and the one or more second chiplets are positioned in a second row of chiplets.

14. The apparatus of claim 10, wherein the one or more first chiplets are coupled to the central chiplet by a plurality of fanout trace layers layered on a wafer including the central chiplet, the one or more first chiplets, and the one or more second chiplets positioned and fixed using molding.

15. The apparatus of claim 14, wherein the one or more interconnect dies are bonded to a redistribution layer of the chip layered on the plurality of fanout trace layers.

16. The apparatus of claim 10, wherein the chip comprises one or more conductive pillars.

17. The apparatus of claim 16, further comprising a plurality of caps for the one or more conductive pillars and the one or more interconnect dies (ICDs).

18. The apparatus of claim 10, wherein the one or more second chiplets include a plurality of second chiplets, the one or more interconnecting dies include a plurality of interconnecting dies, and wherein each of the plurality of second chiplets is coupled to the central chiplet using a respective interconnecting die of the plurality of interconnecting dies.

19. A method of hybrid bridged fanout chiplet connectivity, the method comprising:
coupling, to a central chiplet of a chip, one or more first chiplets using a plurality of fanout traces and not connected to the central chiplet using an interconnect die; and
coupling, to the central chiplet, one or more second chiplets using one or more interconnect dies (ICDs), wherein the one or more interconnect dies are in a layer that does not include the plurality of fanout traces.

20. The method of claim 19, wherein each of the one or more second chiplets are positioned nearer to the central chiplet relative to the one or more first chiplets.

21. The method of claim 19, wherein the one or more first chiplets are positioned in a first column of chiplets and the one or more second chiplets are positioned in a second column of chiplets.

22. The method of claim 19, wherein the one or more first chiplets are positioned in a first row of chiplets and the one or more second chiplets are positioned in a second row of chiplets.

23. The method of claim 19, wherein coupling, to the central chiplet, the one or more first chiplets comprises layering a plurality of fanout trace layers on a wafer including the central chiplet, the one or more first chiplets, and the one or more second chiplets positioned and fixed using molding.

24. The method of claim 19, wherein coupling, to the central chiplet, the one or more second chiplets comprises bonding the one or more interconnect dies to a redistribution layer of the chip.

25. The method of claim 19, further comprising forming one or more conductive pillars in a layer of the chip.

26. The method of claim 25, further comprising capping the one or more conductive pillars and the one or more interconnect dies.

27. The method of claim 19, wherein the one or more second chiplets include a plurality of second chiplets, the one or more interconnecting dies include a plurality of interconnecting dies, and wherein each of the plurality of second chiplets is coupled to the central chiplet using a respective interconnecting die of the plurality of interconnecting dies.

* * * * *